US006881267B2

(12) United States Patent
Kim

(10) Patent No.: US 6,881,267 B2
(45) Date of Patent: Apr. 19, 2005

(54) PHOTORESIST SUPPLY APPARATUS FOR PREVENTING PHOTORESIST LOSS THROUGH DRAIN LINE

(75) Inventor: Kwang-Il Kim, Kyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/771,982

(22) Filed: Feb. 3, 2004

(65) Prior Publication Data

US 2004/0159400 A1 Aug. 19, 2004

(30) Foreign Application Priority Data

Feb. 7, 2003 (KR) .................................. 10-2003-0007871

(51) Int. Cl.[7] .............................................. B05C 11/10
(52) U.S. Cl. ........................ 118/683; 118/685; 118/684; 118/694; 118/693; 118/688; 118/712; 222/55; 222/65; 222/64
(58) Field of Search ................................ 118/683, 684, 118/685, 694, 693, 668, 712; 137/255, 392, 393, 386; 222/55, 64, 65, 66, 67; 239/350, 352

(56) References Cited

U.S. PATENT DOCUMENTS 5,383,574 A * 1/1995 Raphael ......................... 222/1

6,017,393 A 1/2000 Liu et al.
6,245,148 B1 * 6/2001 Liang et al. ................. 118/683
2002/0050247 A1 * 5/2002 Sekiguchi et al. ........... 118/694

FOREIGN PATENT DOCUMENTS

KR 2000-0008956 5/2000

OTHER PUBLICATIONS

English language Abstract of Korean Patent Publication No. 2000–0008956.

* cited by examiner

*Primary Examiner*—Chris Fiorilla
*Assistant Examiner*—George Koch
(74) *Attorney, Agent, or Firm*—Marger Johnson & McCollom, P.C.

(57) ABSTRACT

A photoresist supply apparatus is provided. The photoresist supply apparatus includes a lower photoresist sensor and an upper photoresist sensor respectively installed near the bottom and the top of a trap tank to detect a photoresist in the trap tank. A drain line is connected to an upper side of the trap tank to release air. A photoresist-blocking valve is installed at the drain line, the photoresist-blocking valve structured to be opened to release air or closed to prevent photoresist loss according to signals detected by the lower photoresist sensor and the upper photoresist sensor. While the photoresist is supplied into the trap tank, the photoresist-blocking valve is opened to release air. After the photoresist supply into the trap tank is completed, the photoresist-blocking valve is closed to prevent the loss of a large amount of the photoresist through the drain line.

17 Claims, 2 Drawing Sheets

PHOTORESIST SUPPLY APPARATUS FOR PREVENTING PHOTORESIST LOSS THROUGH DRAIN LINE

BACKGROUND OF THE INVENTION

This application claims priority from Korean Patent Application No. 2003-7871, filed on Feb. 7, 2003, in the Korean Intellectual Property Office, the disclosure of which is incorporated herein by reference in its entirety.

1. Field of the Invention

The present invention relates to an apparatus used in semiconductor device fabrication, and more particularly, to a photoresist supply apparatus for a photolithography process used in semiconductor device fabrication.

2. Description of the Related Art

Generally, semiconductor device fabrication is a multistep sequence from wafer preparation to semiconductor chip packaging. In detail, semiconductor device fabrication includes process steps such as forming thin films on a wafer, ion implantation for injecting dopants into the wafer, photolithographic processes for patterning the thin films on the wafer, testing semiconductor devices on the wafer, and cutting (dicing) the wafer into individual chips and then packaging of diced chips. Among the above process steps, in the photolithographic process, photoresists are used for pattern formation. The photoresist is applied as a thin film on the wafer and is subsequently exposed through mask to light to create a photoresist pattern.

FIG. 1 is a schematic illustration of a conventional photoresist supply apparatus and a photoresist supply scheme using the apparatus.

Referring to FIG. 1, a conventional photoresist supply apparatus 101 includes a first photoresist bottle 10 and a second photoresist bottle 30. A first photoresist 50 contained in the first photoresist bottle 10 is supplied into a photoresist pump 110 via a first photoresist supply line 60, a first trap tank 70, and a valve 90, and then dispensed onto a wafer. A second photoresist 130 contained in the second photoresist bottle 30 is supplied into the photoresist pump 110 via a second photoresist supply line 140, a second trap tank 150, and the valve 90, and then dispensed onto the wafer.

A photoresist supply scheme using the above conventional photoresist supply apparatus will now be described in detail with reference to FIG. 1.

When the first photoresist 50 is mostly consumed, i.e., the first photoresist bottle 10 is almost empty, during supply of the first photoresist 50, a first photoresist sensor 160, which is installed near the first trap tank 70, detects the absence of the first photoresist 50 and then transmits an electrical signal to the valve 90, thereby connecting the valve 90 to the second photoresist supply line 140. At this time, a first ON/OFF valve 190 of a first drain line 170 connected to the first trap tank 70 is closed. Therefore, supply of the first photoresist 50 through the first photoresist supply line 60 is stopped. It is understood that the first photoresist bottle 10 is changed to a new one for successive semiconductor device fabrication.

When the first photoresist 50 in the first photoresist bottle 10 is consumed, a photoresist supply is carried out using the second photoresist bottle 30 as explained below. First, nitrogen is supplied into the second photoresist bottle 30 via a nitrogen supply line 210. When the supplied nitrogen pressurizes the second photoresist 130 in the second photoresist bottle 30, the second photoresist supply line 140 and the second trap tank 150 are filled with the second photoresist 130 and residual air is released via a second drain line 230. When the supply of the second photoresist 130 containing no air into the second trap tank 150 is completed, a second ON/OFF valve 250 is closed. Accordingly, nitrogen supply through the nitrogen supply line 210 is stopped. The second photoresist 130 filled in the second trap tank 150 is supplied into the photoresist pump 110 via the second photoresist supply line 140 and the valve 90.

On the other hand, at an initial stage of the supply of the second photoresist 130 into the second photoresist supply line 140, air is present in the second photoresist supply line 140. If the air is incorporated into the second photoresist 130 while the second photoresist 130 passes through the second photoresist supply line 140, air bubbles can be generated, thereby adversely affecting a photolithographic process. Therefore, the air in the second photoresist supply line 140 must be released via the second drain line 230 and the second ON/OFF valve 250. That is, at an initial stage of the supply of the second photoresist 130 into the second photoresist supply line 140, the second ON/OFF valve 250 is opened so that the supply of the second photoresist 130 is carried out, simultaneously with releasing air.

In this way, when the second photoresist 130 is supplied through the second photoresist supply line 140 while the second ON/OFF valve 250 is kept open, a large amount of the second photoresist 130 is dissipated through the second drain line 230. That is, when a used photoresist bottle is changed to a new one, a large amount of a photoresist is wasted through the drain line 230. In FIG. 1, a reference numeral 270 denotes a second photoresist sensor detecting the second photoresist in the second trap tank 150. Arrows represented in the first photoresist supply line 60 and the second photoresist supply line 140 denote the flow of the first photoresist 50 and the second photoresist 130. Arrows represented in the second photoresist bottle 30 denote nitrogen flow directions.

SUMMARY OF THE INVENTION

The present invention provides a photoresist supply apparatus capable of preventing photoresist loss through a drain line when photoresist supply lines are switched.

According to an aspect of the present invention, a photoresist supply apparatus comprises a photoresist bottle for containing a photoresist; and a trap tank for storing the photoresist supplied from the photoresist bottle via a first photoresist supply line. A lower photoresist sensor and an upper photoresist sensor are respectively installed near the bottom and the top of the trap tank to detect the photoresist in the trap tank.

A drain line is preferably connected to an upper side of the trap tank to release air. A photoresist-blocking valve is preferably installed at the drain line, the photoresist-blocking valve structured to be opened to release air or closed to prevent photoresist loss according to signals detected by the lower photoresist sensor and the upper photoresist sensor. The photoresist supply apparatus preferably comprises a photoresist pump for dispensing, onto a wafer, the photoresist supplied through a second photoresist supply line connected to a lower side of the trap tank.

According to specific embodiments, the photoresist supply apparatus may further comprise a bottle change valve installed at the second photoresist supply line connected to the lower side of the trap tank. The photoresist supply apparatus may further comprise a nitrogen supply line connected to the photoresist bottle, wherein nitrogen is supplied into the photoresist bottle through the nitrogen supply line to pressurize the photoresist in the photoresist bottle, and a button valve is installed at the nitrogen supply line to control nitrogen supply.

When the lower photoresist sensor is in an ON state and the upper photoresist sensor is in an ON or OFF state, the photoresist-blocking valve may be closed. When the lower photoresist sensor is in an OFF state and the upper photoresist sensor is in an OFF state, the photoresist-blocking valve may be opened.

While the photoresist of the trap tank is consumed and photoresist supply into the trap tank is carried out, when the lower photoresist sensor is in an ON state and the upper photoresist sensor is in an OFF state, the photoresist-blocking valve may be opened. While the photoresist of the trap tank is consumed and photoresist supply into the trap tank is carried out, when the lower photoresist sensor is in an ON state and the upper photoresist sensor is in an ON state, the photoresist-blocking valve may be closed.

When sensitivity of the lower photoresist sensor or the upper photoresist sensor is decreased and one of the lower photoresist sensor and the upper photoresist sensor is in an ON state, the photoresist-blocking valve may be closed after a predetermined period.

According to another aspect of the present invention, a photoresist supply apparatus comprises a first photoresist bottle for containing a first photoresist; and a first trap tank for storing the first photoresist supplied from the first photoresist bottle via a first photoresist supply line. A first lower photoresist sensor and a first upper photoresist sensor are respectively installed near the bottom and the top of the first trap tank to detect the first photoresist in the first trap tank.

A first drain line preferably is connected to an upper side of the first trap tank to release air. A first photoresist-blocking valve is preferably installed at the first drain line, the first photoresist-blocking valve structured to be opened to release air or closed to prevent photoresist loss according to signals detected by the first lower photoresist sensor and the first upper photoresist sensor.

The photoresist supply apparatus comprises, in addition to the first photoresist bottle, a second photoresist bottle for containing a second photoresist; and a second trap tank for storing the second photoresist supplied from the second photoresist bottle via a third photoresist supply line. A second lower photoresist sensor and a second upper photoresist sensor are respectively installed near the bottom and the top of the second trap tank to detect the second photoresist in the second trap tank.

A second drain line is preferably connected to an upper side of the second trap tank to release air. A second photoresist-blocking valve is preferably installed at the second drain line, the second photoresist-blocking valve structured to be opened to release air or closed to prevent photoresist loss according to signals detected by the second lower photoresist sensor and the second upper photoresist sensor. The photoresist supply apparatus comprises a photoresist pump for dispensing, onto a wafer, one of the first photoresist and the second photoresist supplied through a second photoresist supply line and a fourth photoresist supply line connected to a lower side of the first trap tank and a lower side of the second trap tank, respectively.

According to specific embodiments, the photoresist supply apparatus may further comprise a bottle change valve commonly installed at the second photoresist supply line and the fourth photoresist supply line, wherein the bottle change valve allows the photoresist pump to be connected to the second photoresist supply line or the fourth photoresist supply line according to signals detected by the first lower photoresist sensor and the second lower photoresist sensor.

While the photoresist pump is connected to the second photoresist supply line through the bottle change valve, when the first lower photoresist sensor is in an ON state and the first upper photoresist sensor is in an ON or OFF state, the first photoresist-blocking valve may be closed.

While the photoresist pump is connected to the second photoresist supply line through the bottle change valve, when the first lower photoresist sensor is in an OFF state and the first upper photoresist sensor is in an OFF state, the first photoresist-blocking valve may be opened.

While the first photoresist of the first trap tank is consumed, the photoresist pump is connected to the fourth photoresist supply line through the bottle change valve, and supply of the second photoresist into the second trap tank is carried out, when the second lower photoresist sensor is in an ON state and the second upper photoresist sensor is in an OFF state, the second photoresist-blocking valve may be opened. While the first photoresist of the first trap tank is consumed, the photoresist pump is connected to the fourth photoresist supply line through the bottle change valve, and supply of the second photoresist into the second trap tank is carried out, when the second lower photoresist sensor is in an ON state and the second upper photoresist sensor is in an ON state, the second photoresist-blocking valve may be closed.

When sensitivity of the first lower photoresist sensor or the first upper photoresist sensor is decreased and one of the first lower photoresist sensor and the first upper photoresist sensor is in an ON state, the first photoresist-blocking valve may be closed after a predetermined period.

When sensitivity of the second lower photoresist sensor or the second upper photoresist sensor is decreased and one of the second lower photoresist sensor and the second upper photoresist sensor is in an ON state, the second photoresist-blocking valve may be closed after a predetermined period.

The photoresist supply apparatus may further comprise a first nitrogen supply line and a second nitrogen supply line respectively connected to the first photoresist bottle and the second photoresist bottle, wherein nitrogen is supplied into the first photoresist bottle and the second photoresist bottle through the first nitrogen supply line and the second nitrogen supply line to pressurize the first photoresist in the first photoresist bottle and the second photoresist in the second photoresist bottle, and a first button valve and a second button valve are respectively installed at the first nitrogen supply line and the second nitrogen supply line to control nitrogen supply.

Therefore, while the photoresist is supplied into the trap tank, the photoresist-blocking valve is opened to release air. After photoresist supply into the trap tank is completed, the photoresist-blocking valve is closed to prevent the loss of a large amount of the photoresist through the drain line.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference to the accompanying drawings. However, the present invention is not limited to exemplary embodiments as will be described later, and thus, various changes thereof may be made within the scope of the present invention. Exemplary embodiments of the present invention are provided so that those of ordinary skill in the art can understand the present invention. It should be noted that the particular terms and expressions employed and the particular structural and operational details disclosed in the detailed description and accompanying drawings are for illustrative purposes only and are not intended to in any way limit the scope of the invention as described in the appended claims.

Figure 1:
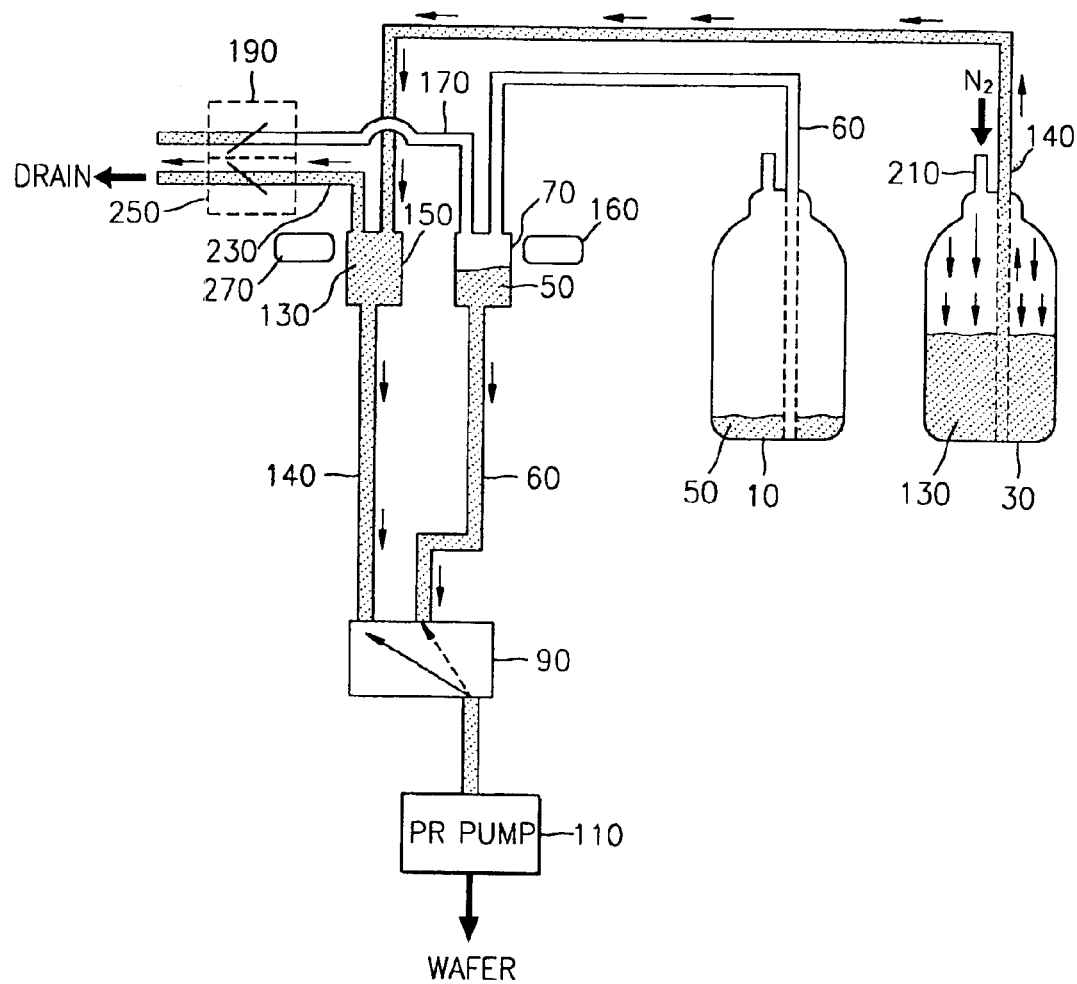
FIG. 1 is a schematic illustration of a conventional photoresist supply apparatus and a photoresist supply scheme using the apparatus.
Figure 2:
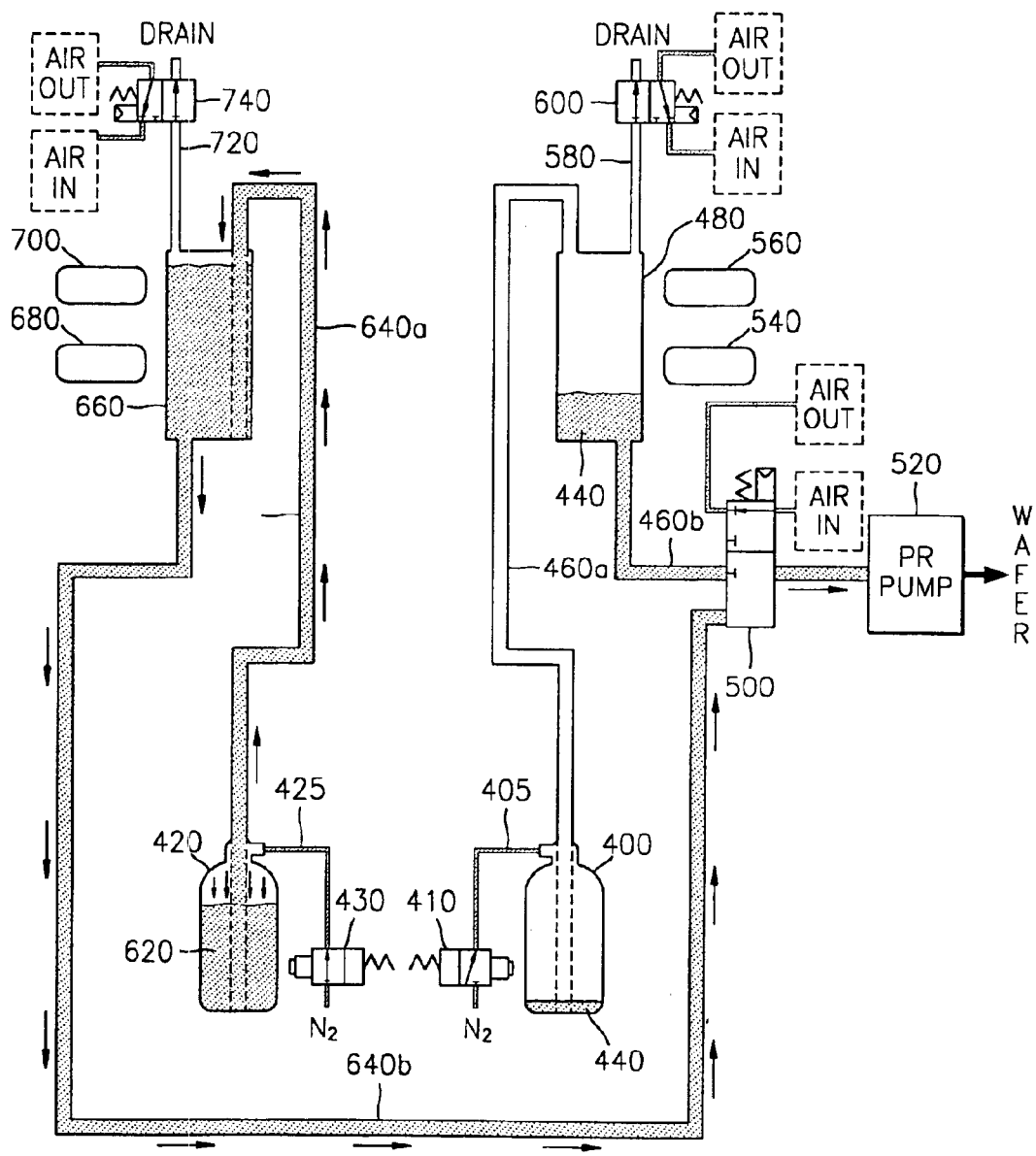
FIG. 2 is a schematic illustration of a photoresist supply apparatus and a photoresist supply scheme using the apparatus according to an embodiment of the present invention.

FIG. 2 is a schematic illustration of a photoresist supply apparatus and a photoresist supply scheme using the apparatus according to an embodiment of the present invention.

Referring to FIG. 2, a photoresist supply apparatus 201 includes a first photoresist bottle 400 and a second photoresist bottle 420. A first nitrogen supply line 405 is connected to the first photoresist bottle 400 and a first button valve 410 is installed at the first nitrogen supply line 405. A second nitrogen supply line 425 is connected to the second photoresist bottle 420 and a second button valve 430 is installed at the second nitrogen supply line 425. The first and second button valves 410 and 430 efficiently pressurize a first photoresist 440 and a second photoresist 620 in the first and second photoresist bottles 400 and 420, respectively, relative to ON/OFF valves, and help prevent an operator error.

The first photoresist 440 contained in the first photoresist bottle 400 is introduced into a photoresist pump 520 via a first photoresist supply line 460a, a first trap tank 480, a second photoresist supply line 460b, and a bottle change valve 500 and then dispensed onto a wafer. The second photoresist supply line 460b is connected to a lower side of the first trap tank 480. A first lower photoresist sensor 540 and a first upper photoresist sensor 560 are respectively installed near the bottom and the top of the first trap tank 480 to detect the first photoresist 440 in the first trap tank 480. A first drain line 580 is connected to an upper side of the first trap tank 480. A first photoresist-blocking valve 600 is installed at the first drain line 580.

The first lower photoresist sensor 540 serves to convert the presence and absence of the first photoresist 440 in the first trap tank 480 into electrical signals. The electrical signals are transmitted to the bottle change valve 500 through a main controller (not shown). The first upper photoresist sensor 560 serves to convert the presence and absence of the first photoresist 440 in the first trap tank 480 into electrical signals. The electrical signals are transmitted to the first photoresist-blocking valve 600 through the main controller.

The second photoresist 620 contained in the second photoresist bottle 420 is introduced into the photoresist pump 520 via a third photoresist supply line 640a, a second trap tank 660, a fourth photoresist supply line 640b, and the bottle change valve 500 and then dispensed onto the wafer. The fourth photoresist supply line 640b is connected to a lower side of the second trap tank 660. A second lower photoresist sensor 680 and a second upper photoresist sensor 700 are respectively installed near the bottom and the top of the second trap tank 660 to detect the second photoresist 620 in the second trap tank 660. A second drain line 720 is connected to an upper side of the second trap tank 660. A second photoresist-blocking valve 740 is installed at the second drain line 720.

The second lower photoresist sensor 680 serves to convert the presence and absence of the second photoresist 620 in the second trap tank 660 into electrical signals. The electrical signals are transmitted to the bottle change valve 500 through the main controller. The second upper photoresist sensor 700 serves to convert the presence and absence of the second photoresist 620 in the second trap tank 660 into electrical signals. The electrical signals are transmitted to the second photoresist-blocking valve 740 through the main controller.

A photoresist supply scheme using a photoresist supply apparatus according to an embodiment of the present invention will now be described in detail with reference to FIG. 2.

In detail, if the first trap tank 480 is filled with the first photoresist 440, and thus, the first lower photoresist sensor 540 and the first upper photoresist sensor 560 are in an ON state (photoresist detection), the first photoresist-blocking valve 600 is closed. If the first photoresist 440 is supplied from the first photoresist bottle 400 to the first trap tank 480, and thus, the first photoresist 440 is slightly present in the first photoresist bottle 400, when the first lower photoresist sensor is in an ON state and the first upper photoresist sensor 560 is in an OFF state, the first photoresist-blocking valve 600 is closed.

On the other hand, if the first photoresist 440 is not detected by the first lower and upper photoresist sensors 540 and 560 (OFF state) as a result of consumption of the first photoresist 440 in the first photoresist bottle 400 during the supply of the first photoresist 440 from the first photoresist bottle 400, an electrical signal from the first lower photoresist sensor 540 is transmitted to the bottle change valve 500 via the main controller, thereby connecting the bottle change valve 500 to the fourth photoresist supply line 640b. In this case, the first photoresist-blocking valve 600 of the first drain line 580 is preferably kept open. Therefore, the supply of the first photoresist 440 through the second photoresist supply line 460b is stopped. One skilled in the art will understand that the first photoresist bottle 400 is replaced with a new one for successive semiconductor device fabrication.

A photoresist supply scheme after the first photoresist 440 of the first photoresist bottle 400 is consumed will now be described in terms of the second photoresist bottle 420. First, nitrogen is introduced into the second photoresist bottle 420 via the second nitrogen supply line 425. The supplied nitrogen pressurizes the second photoresist 620 in the second photoresist bottle 420, as represented by arrows. Therefore, the third photoresist supply line 640a and the second trap tank 660 are filled with the second photoresist 620. Then, the second photoresist is introduced into the photoresist pump 520 via the fourth photoresist supply line 640b and the bottle change valve 500.

When the supply of the second photoresist 620 into the third photoresist supply line 640a is begun, the second lower photoresist sensor 680 is in an ON state (detection of the second photoresist) and the second upper photoresist sensor 700 is in an OFF state (no detection of the second photoresist). In this case, the second photoresist-blocking valve 740 is opened, thereby releasing air contained in the third photoresist supply line 640a via the second drain line 720.

If both of the second lower photoresist sensor 680 and the second upper photoresist sensor 700 are in an ON state as a result of continuous supply of the second photoresist 620 into the third photoresist supply line 640a, the second photoresist-blocking valve 740 is closed. As a result, release of the second photoresist 620 through the second drain line 720 is prevented. That is, while the second photoresist 620 is supplied into the second trap tank 660, the second photoresist-blocking valve 740 is opened to release air. After the second trap tank 660 is filled with the second photoresist 620, the second photoresist-blocking valve 740 is closed to prevent loss of a large amount of the second photoresist 620 through the second drain line 720.

Meanwhile, sensitivities of the first lower photoresist sensor 540, the first upper photoresist sensor 560, the second lower photoresist sensor 680, and the second upper photoresist sensor 700 may be decreased. In this case, the first photoresist 440 and the second photoresist 620 may undergo overflow through the first and second drain lines 580 and 720, respectively.

In this regard, when one of the first lower photoresist sensor 540 and the first upper photoresist sensor 560 is in an ON state, the first photoresist-blocking valve 600 is set to be closed after a predetermined period. Similarly, when one of the second lower photoresist sensor 680 and the second upper photoresist sensor 700 is in an ON state, the second photoresist-blocking valve 740 is set to be closed after a predetermined period.

For example, when the first lower photoresist sensor 540 is in an ON state and the first upper photoresist sensor 560 is in an OFF state, the first photoresist-blocking valve 600 is automatically closed after a predetermined period. Also, when the second lower photoresist sensor 680 is in an OFF state and the second upper photoresist sensor 700 is in an ON state, the second photoresist-blocking valve 740 is automatically closed after a predetermined period.

Consequently, even though sensitivities of the first lower photoresist sensor 540, the first upper photoresist sensor 560, the second lower photoresist sensor 680, and the second upper photoresist sensor 700 are decreased, the loss of the first photoresist 440 and the second photoresist 620 through the first drain line 580 and the second drain line 720 can be prevented or substantially reduced.

As is apparent from the above description, a photoresist supply apparatus according to an embodiment of the present invention can provide the following advantages. While a photoresist is supplied into a trap tank, a photoresist-blocking valve is opened to release air. After the supply of the photoresist into the trap tank is completed, the photoresist-blocking valve is closed to prevent the loss of a large amount of the photoresist through a drain line.

Furthermore, even though sensitivities of a lower photoresist sensor and an upper photoresist sensor installed near the trap tank decrease, the photoresist loss through the drain line can be prevented.

While the invention has been particularly shown and described with reference to described embodiments thereof, it will be understood by those skilled in the art that the foregoing and other changes in form and details may be made therein without departing from the spirit and scope of the invention.

What is claimed is:

1. A photoresist supply apparatus comprising:
    a photoresist bottle for containing a photoresist;
    a trap tank for storing the photoresist supplied from the photoresist bottle via a first photoresist supply line;
    a lower photoresist sensor and an upper photoresist sensor respectively installed near a bottom and a top of the trap tank to detect the photoresist in the trap tank;
    a drain line connected to an upper side of the trap tank to release air;
    a photoresist-blocking valve installed at the drain line, the photoresist-blocking valve structured to be opened to release air or closed to prevent a photoresist loss according to signals detected by the lower photoresist sensor and the upper photoresist sensor; and
    a photoresist pump for dispensing, onto a wafer, the photoresist supplied through a second photoresist supply line connected to a lower side of the trap tank.

2. The photoresist supply apparatus according to claim 1, further comprising a bottle change valve installed at the second photoresist supply line connected to the lower side of the trap tank.

3. The photoresist supply apparatus according to claim 1, further comprising a nitrogen supply line connected to the photoresist bottle,
    wherein nitrogen is supplied into the photoresist bottle through the nitrogen supply line to pressurize the photoresist in the photoresist bottle, and a button valve is installed at the nitrogen supply line to control nitrogen supply.

4. The photoresist supply apparatus according to claim 1, wherein when the lower photoresist sensor is in an ON state and the upper photoresist sensor is in an ON or OFF state, the photoresist-blocking valve is closed.

5. The photoresist supply apparatus according to claim 1, wherein when the lower photoresist sensor is in an OFF state and the upper photoresist sensor is in an OFF state, the photoresist-blocking valve is opened.

6. The photoresist supply apparatus according to claim 1, wherein while the photoresist of the trap tank is consumed and photoresist supply into the trap tank is carried out, when the lower photoresist sensor is in an ON state and the upper photoresist sensor is in an OFF state, the photoresist-blocking valve is opened.

7. The photoresist supply apparatus according to claim 1, wherein while the photoresist of the trap tank is consumed and photoresist supply into the trap tank is carried out, when the lower photoresist sensor is in an ON state and the upper photoresist sensor is in an ON state, the photoresist-blocking valve is closed.

8. The photoresist supply apparatus according to claim 1, wherein when sensitivity of the lower photoresist sensor or the upper photoresist sensor is decreased and one of the lower photoresist sensor and the upper photoresist sensor is in an ON state, the photoresist-blocking valve is closed after a predetermined period.

9. A photoresist supply apparatus comprising:
    a first photoresist bottle for containing a first photoresist;
    a first trap tank for storing the first photoresist supplied from the first photoresist bottle via a first photoresist supply line;
    a first lower photoresist sensor and a first upper photoresist sensor respectively installed near the bottom and the top of the first trap tank to detect the first photoresist in the first trap tank;

a first drain line connected to an upper side of the first trap tank to release air;

a first photoresist-blocking valve installed at the first drain line, the first photoresist-blocking valve structured to be opened to release air or being closed to prevent photoresist loss according to signals detected by the first lower photoresist sensor and the first upper photoresist sensor;

a second photoresist bottle for containing a second photoresist;

a second trap tank for storing the second photoresist supplied from the second photoresist bottle via a third photoresist supply line;

a second lower photoresist sensor and a second upper photoresist sensor respectively installed near the bottom and the top of the second trap tank to detect the second photoresist in the second trap tank;

a second drain line connected to an upper side of the second trap tank to release air;

a second photoresist-blocking valve installed at the second drain line, the second photoresist-blocking valve structured to be opened to release air or being closed to prevent photoresist loss according to signals detected by the second lower photoresist sensor and the second upper photoresist sensor; and a photoresist pump for dispensing, onto a wafer, one of the first photoresist and the second photoresist supplied through a second photoresist supply line and a fourth photoresist supply line connected to a lower side of the first trap tank and a lower side of the second trap tank, respectively.

10. The photoresist supply apparatus according to claim 9, further comprising a bottle change valve commonly installed at the second photoresist supply line and the fourth photoresist supply line, wherein the bottle change valve allows the photoresist pump to be connected to the second photoresist supply line or the fourth photoresist supply line according to signals detected by the first lower photoresist sensor and the second lower photoresist sensor.

11. The photoresist supply apparatus according to claim 10, wherein while the photoresist pump is connected to the second photoresist supply line through the bottle change valve, when the first lower photoresist sensor is in an ON state and the first upper photoresist sensor is in an ON or OFF state, the first photoresist-blocking valve is closed.

12. The photoresist supply apparatus according to claim 10, wherein while the photoresist pump is connected to the second photoresist supply line through the bottle change valve, when the first lower photoresist sensor is in an OFF state and the first upper photoresist sensor is in an OFF state, the first photoresist-blocking valve is opened.

13. The photoresist supply apparatus according to claim 10, wherein while the first photoresist of the first trap tank is consumed, the photoresist pump is connected to the fourth photoresist supply line through the bottle change valve, and supply of the second photoresist into the second trap tank is carried out, when the second lower photoresist sensor is in an ON state and the second upper photoresist sensor is in an OFF state, the second photoresist-blocking valve is opened.

14. The photoresist supply apparatus according to claim 10, wherein while the first photoresist of the first trap tank is consumed, the photoresist pump is connected to the fourth photoresist supply line through the bottle change valve, and supply of the second photoresist into the second trap tank is carried out, when the second lower photoresist sensor is in an ON state mid the second upper photoresist sensor is in an ON state, the second photoresist-blocking valve is closed.

15. The photoresist supply apparatus according to claim 9, wherein when sensitivity of the first lower photoresist sensor or the first upper photoresist sensor is decreased and one of the first lower photoresist sensor and the first upper photoresist sensor is in an ON state, the first photoresist-blocking valve is closed after a predetermined period.

16. The photoresist supply apparatus according to claim 9, wherein when sensitivity of the second lower photoresist sensor or the second upper photoresist sensor is decreased and one of the second lower photoresist sensor and the second upper photoresist sensor is in an ON state, the second photoresist-blocking valve is closed after a predetermined period.

17. The photoresist supply apparatus according to claim 9, further comprising a first nitrogen supply line and a second nitrogen supply line respectively connected to the first photoresist bottle and the second photoresist bottle, wherein nitrogen is supplied into the first photoresist bottle and the second photoresist bottle through the first nitrogen supply line and the second nitrogen supply line to pressurize the first photoresist in the first photoresist bottle and the second photoresist in the second photoresist bottle, and a first button valve and a second button valve are respectively installed at the first nitrogen supply line and the second nitrogen supply line to control nitrogen supply.

* * * * *